(12) United States Patent
Vancura et al.

(10) Patent No.: US 7,582,514 B2
(45) Date of Patent: *Sep. 1, 2009

(54) MICROELECTROMECHANICAL SYSTEMS ENCAPSULATION PROCESS WITH ANTI-STICTION COATING

(75) Inventors: Cyril Vancura, Palo Alto, CA (US); Markus Ulm, Wannweil (DE); Brian Stark, San Francisco, CA (US); Matthias Metz, Palo Alto, CA (US); Tino Fuchs, Tubingen (DE); Franz Laermer, Weilder Stadt (DE); Silvia Kronmueller, Schwaikheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/844,844

(22) Filed: Aug. 24, 2007

(65) Prior Publication Data

US 2008/0050861 A1 Feb. 28, 2008

Related U.S. Application Data

(63) Continuation-in-part of application No. 11/510,040, filed on Aug. 25, 2006.

(51) Int. Cl.
H01L 21/44 (2006.01)
(52) U.S. Cl. ...................... 438/127; 438/125
(58) Field of Classification Search ................ 438/125, 438/127; 257/E23.193, E33.059, E51.02
See application file for complete search history.

(56) References Cited

U.S. PATENT DOCUMENTS

| | | | |
|---|---|---|---|
| 5,470,627 A * | 11/1995 | Lee et al. | 428/64.4 |
| 5,683,591 A | 11/1997 | Offenberg | |
| 6,808,953 B2 | 10/2004 | Partridge | |
| 6,930,367 B2 * | 8/2005 | Lutz et al. | 257/417 |
| 6,936,491 B2 | 8/2005 | Partridge | |
| 6,936,902 B2 | 8/2005 | Reichenbach | |
| 6,939,809 B2 | 9/2005 | Partridge | |
| 6,952,041 B2 | 10/2005 | Lutz | |
| 2003/0187555 A1 | 10/2003 | Lutz | |
| 2003/0211650 A1 * | 11/2003 | Martin | 438/50 |
| 2004/0124481 A1 | 7/2004 | Partridge | |
| 2004/0124483 A1 | 7/2004 | Partridge | |
| 2004/0163476 A1 | 8/2004 | Partridge | |
| 2004/0183214 A1 | 9/2004 | Partridge | |

(Continued)

FOREIGN PATENT DOCUMENTS

WO WO 2006015901 A1 2/2006

OTHER PUBLICATIONS

Form PCT/ISA/220, "PCT Notification of Transmittal of The International Search Report and the Written Opinion of the International Searching Authority, or the Declaration," 2 pgs.

(Continued)

*Primary Examiner*—Thao P. Le
(74) *Attorney, Agent, or Firm*—Courtney Staniford & Gregory LLP

(57) ABSTRACT

An encapsulated MEMS process including a high-temperature anti-stiction coating that is stable under processing steps at temperatures over 450° C. is described. The coating is applied after device release but before sealing vents in the encapsulation layer. Alternatively, an anti-stiction coating may be applied to released devices directly before encapsulation.

27 Claims, 11 Drawing Sheets

U.S. PATENT DOCUMENTS

| | | |
|---|---|---|
| 2004/0207489 A1 | 10/2004 | Lutz |
| 2004/0209435 A1 | 10/2004 | Partridge |
| 2004/0245586 A1 | 12/2004 | Partridge |
| 2004/0248344 A1 | 12/2004 | Partridge |
| 2005/0014374 A1 | 1/2005 | Partridge |
| 2005/0019974 A1 | 1/2005 | Lutz |
| 2005/0037135 A1 | 2/2005 | Zhu |
| 2005/0073078 A1 | 4/2005 | Lutz |
| 2005/0093134 A1* | 5/2005 | Tarn ........................... 257/706 |
| 2005/0095833 A1* | 5/2005 | Lutz et al. ................... 438/597 |
| 2005/0106318 A1 | 5/2005 | Partridge |
| 2005/0106320 A1 | 5/2005 | Mehregany |
| 2005/0142688 A1 | 6/2005 | Partridge |
| 2005/0151592 A1 | 7/2005 | Partridge |
| 2005/0156260 A1 | 7/2005 | Partridge |
| 2005/0162239 A1 | 7/2005 | Lutz |
| 2005/0179099 A1 | 8/2005 | Lutz |
| 2005/0195050 A1 | 9/2005 | Lutz |
| 2005/0242904 A1 | 11/2005 | Lutz |
| 2005/0253209 A1 | 11/2005 | Lutz |
| 2005/0255645 A1 | 11/2005 | Lutz |
| 2005/0260783 A1 | 11/2005 | Lutz |
| 2006/0027020 A1 | 2/2006 | Ocansey et al. |
| 2006/0027884 A1* | 2/2006 | Melzak et al. .............. 257/414 |
| 2006/0290449 A1* | 12/2006 | Piazza et al. ................. 333/187 |
| 2007/0196945 A1* | 8/2007 | Martin ........................ 438/48 |
| 2008/0055703 A1* | 3/2008 | Pan ............................. 359/290 |
| 2008/0138580 A1* | 6/2008 | Low et al. ................... 428/156 |

OTHER PUBLICATIONS

Form PCT/ISA/210, "PCT International Search Report," 4 pgs.
Form PCT/ISA/237, "PCT Written Opinion of the International Searching Authority," 6 pgs.
D. Gao, W. R. Ashurst, C. Carraro, R. T. Howe, R. Maboudian, "Silicon Carbide for Enhanced MEMS Reliability," *In the Proceeding of The 2004 Sensors and Actuators Workshop*, Hilton Head, S.C., 2004.
Candler, W.-T. Park, H. Li, G. Yama, A. Partridge, M. Lutz, T. Kenny, Single Wafer Encapsulation of MEMS Devices *in IEEE Transactions on Advanced Packaging*, pp. 227-232, vol. 26, No. 3, 2003.
A. Partridge, A. Rice, T. W. Kenny, M. Lutz, "New thin film epitaxial polysilicon encapsulation for piezoresistive accelerometers," unidentified IEEE publication, p. 54-59, 2001.
S. Roy et al., "The mechanical properties of polycrystalline 3C-SiC films grown on polysilicon substrates by atmospheric pressure chemical-vapor deposition," Journal of Applied Physics, vol. 99, Issue 4, pp. 0044108-0044108-13 (2006).

* cited by examiner

→ Epi-seal but with larger vents at periphery of mechanical structure

→ Epi-seal but with larger vents at periphery of mechanical structure

→ HF vapor etch

→ Transfer to Si/SiC epi reactor

→ Epi-seal but with larger vents at periphery of mechanical structure

→ HF vapor etch

→ In situ hydrogen etch
→ Close small vents with poly-Si epi

- → Epi-seal but with larger vents at periphery of mechanical structure

- → HF vapor etch

- → In situ hydrogen etch
- → Close small vents with poly-Si epi
- → Bleed in propane into reactor → form SiC ASC by carbonizing Si

- → Epi-seal but with larger vents at periphery of mechanical structure
- → HF vapor etch
- → In situ hydrogen etch
- → Close small vents with poly-Si epi
- → Bleed in propane into reactor → form SiC ASC by carbonizing Si Option I:
- → Close larger vents by SiC APCVD with argon carrier gas

- → Epi-seal but with larger vents at periphery of mechanical structure

- → HF vapor etch

- → In situ hydrogen etch
- → Close small vents with poly-Si epi
- → Bleed in propane into reactor → form SiC ASC by carbonizing Si Option II:
- → Close larger vents by Si atmospheric epi with nitrogen back pressure
- → Further processing of wafers

MICROELECTROMECHANICAL SYSTEMS ENCAPSULATION PROCESS WITH ANTI-STICTION COATING

RELATED APPLICATION

This application is a continuation-in-part of U.S. patent application Ser. No. 11/510,040, filed Aug. 25, 2006, which is incorporated herein by reference in its entirety.

TECHNICAL FIELD

The invention relates generally to microelectromechanical systems (MEMS) fabrication processes. In particular it relates to encapsulated MEMS fabrication with improved anti-stiction properties.

BACKGROUND

"Microelectromechanical systems" (MEMS) refers broadly to small, mechanical devices constructed using techniques traditionally associated with integrated circuit wafer processing. In microelectronics, circuits are fabricated on semiconductor wafers upon which minute features are defined by building up and etching back regions of materials with specific electronic properties. Tremendous progress has been made over the past 30 years in making circuits smaller, from the millimeter scale to the micrometer scale to today's nanometer scale features.

Tools for semiconductor processing have become more widely available as the microelectronics industry has matured and that has helped create opportunities for microfabrication of new mechanical devices. These microelectromechanical systems (MEMS) include miniaturized gears, levers, cantilevers, springs, etc. However, physical scaling laws show that mechanical devices on a micro scale can operate quite differently from their everyday cousins and have vastly superior performance in some respects. In other words, they are not simply smaller, but also different. (See, for example, Kurt Petersen, "Silicon as a Mechanical Material", Proceedings of the IEEE, Vol 70, No. 5, May 1982, pages 420-457.)

Perhaps the most important feature defining MEMS in contrast to microelectronics is that MEMS may contain moving parts In most cases, such as MEMS accelerometers or MEMS oscillators, the moving parts must be protected from the environment. A recent advance in MEMS technology is the development of techniques for wafer-level encapsulation of mechanical structures. Encapsulation provides for not only protection of the mechanical components but also for direct integration with electronic devices in the wafer.

A promising encapsulation technique is described by Partridge, et al. in "Microelectromechanical systems, and methods for encapsulating and fabricating same," US Patent Application Publication US 2004/0248344 A1, incorporated herein by reference. Partridge discloses, in part, a thin-film polysilicon encapsulation process that can increase the die count on a wafer by nearly an order of magnitude without a corresponding increase in cost. This technique is showing utility for of micromechanical resonators but has yet to be fully applied to structures that are more likely to come into contact like accelerometers.

Industry experience suggests that accelerometers require anti-stiction coatings for full functionality. An anti-stiction coating prevents silicon surfaces from creating a temporary or permanent bond (stiction) if they touch. Parts in a MEMS accelerometer sometimes come into contact with each other. It is important that they not stick together otherwise the function of the device is ruined. Organic films have been used as anti-stiction coatings in conventional MEMS processes. These films are rarely capable of withstanding process temperatures above about 450° C., however.

The final stages of recent and successful encapsulation methods involve processes at temperatures of at least 450° C. and often as high as 800° C. or above. No suitable organic film anti-stiction coating has been found that is compatible with these processes. Therefore what is needed is a method of incorporating a high-temperature anti-stiction film in a modern encapsulation process.

DETAILED DESCRIPTION

A method for incorporating a high-temperature anti-stiction film in a MEMS encapsulation process is described. The method is illustrated for a process that uses a low-temperature oxide seal (FIGS. 1A-4A) and for a process that uses an epitaxial seal (FIGS. 1B-4B). An alternative embodiment of the method is illustrated in FIGS. 5A and 5B. FIGS. 6-11 illustrate yet further alternative embodiments that include the formation of a silicon carbide (SiC) anti-stiction coating by carbonization of a Si surface of a MEMS structure in the MEMS process. In addition, an embodiment includes combining the formation of the anti-stiction coating and subsequent encapsulation in a single reactor, thus avoiding exposure of the anti-stiction coating to ambient air, which can cause oxidation of the SiC surface. Moreover, SiC itself may be used as the sealing layer for the encapsulation.

As used herein, the term "layers" implies materials formed in sheets substantially parallel to a flat substrate. In contrast the terms "coatings" and "films" imply materials that are applied to surfaces that may lie at arbitrary angles to a substrate including parallel or perpendicular to it.

Figure 1A:
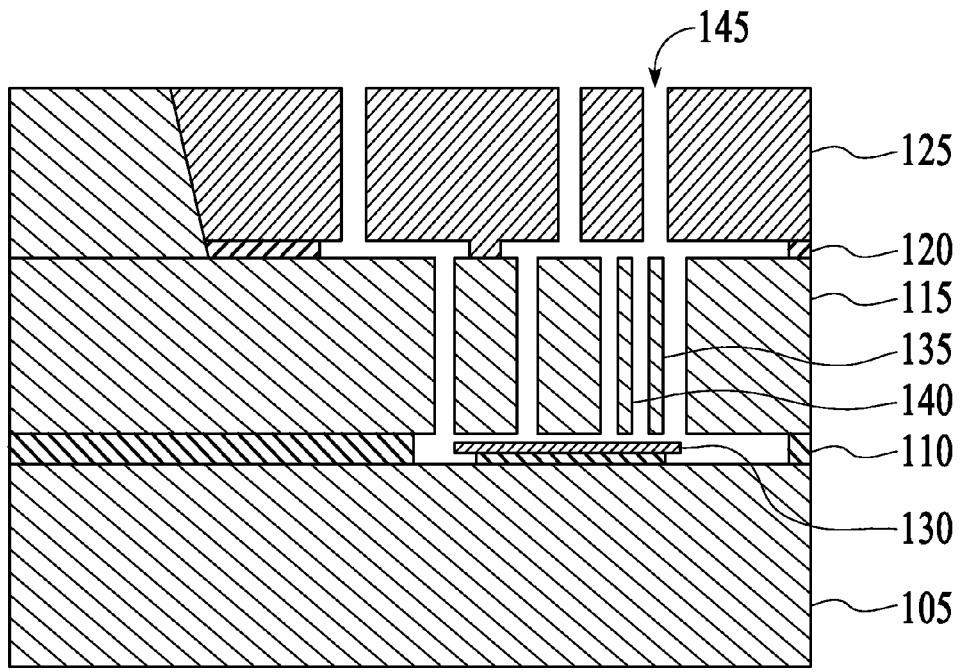
FIGS. 1A and 1B show schematically layers in encapsulated MEMS devices after a vapor-phase etch but before final sealing.
Figure 1B:
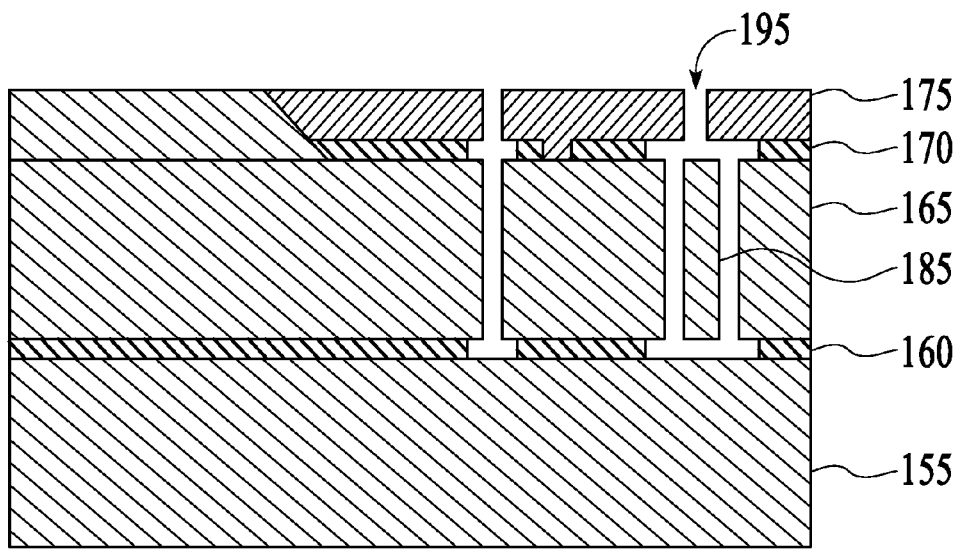

FIGS. 1A and 1B show schematically layers in encapsulated MEMS devices after a vapor-phase etch but before final sealing. Processes leading to the creation of structures such as those shown in FIGS. 1A and 1B are explained in Partridge ("Microelectromechanical systems, and methods for encapsulating and fabricating same," US Patent Application Publication US 2004/0248344 A1) and Candler ("Single Wafer Encapsulation of MEMS Devices," IEEE Transactions on Advanced Packaging, Vol. 26, No. 3, August 2003, pages 227-232) both of which are incorporated herein by reference. In FIGS. 1A and 1B formation of an active layer, patterning of a first seal layer and release have all been completed.

In FIG. 1A layer 105 is a substrate such as a silicon wafer. Clearly other substrate materials such as germanium or III-V materials may be desirable for certain applications. Layer 110 is a buried insulator (normally oxide) layer. Layer 115 is the device layer and normally consists of single- or poly-crystalline epitaxial silicon; however, other materials are possible just as for substrate 105. Substrate 105 and layers 110 and 115 may be conveniently provided in the form of a silicon-on-insulator (SOI) wafer. SOI wafers created by either buried oxide implants or wafer bonding techniques are widely available.

Layer 120 is a sacrificial spacer layer normally consisting of silicon dioxide. Layer 125 is an epitaxial film deposited as an initial encapsulation step. Layer 125, which is commonly an epitaxial silicon film, is patterned to provide vent trenches such as vent 145. Devices such as 135 and 140 in device layer 115 have been released typically by dry etching sacrificial layers 110 and 120. In a typical scenario layers 110 and 120 consist of silicon dioxide which may be etched with an HF vapor etch. Layer 130 is a buried polysilicon layer which serves as an electrical interconnect for MEMS devices.

In FIG. 1B layer 155 is a substrate such as a silicon wafer Layer 160 is a buried insulator (normally oxide) layer. Layer 165 is the device layer and normally consists of single- or poly-crystalline epitaxial silicon; however, other materials are possible just as for substrate 155. Layers 155, 160 and 165 are often provided as an SOI wafer as mentioned above.

Layer 170 is a sacrificial spacer layer normally consisting of silicon dioxide. Layer 175 is an epitaxial film deposited as an initial encapsulation step. Film 175, which is commonly an epitaxial silicon film, is patterned to provide vent trenches such as vent 195. Devices such as 185 in device layer 165 have been released by dry etching sacrificial layers 160 and 170. In a typical scenario layers 160 and 170 consist of silicon dioxide which may be etched with an HF vapor etch.

Figure 2A:
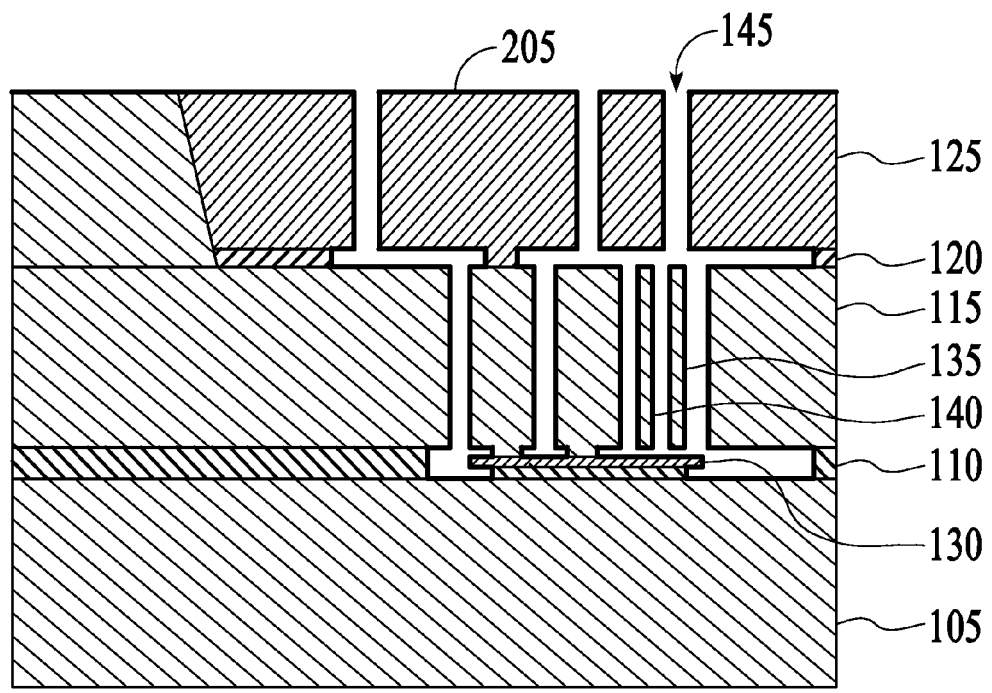
FIGS. 2A and 2B show schematically layers in the encapsulated MEMS devices of FIGS. 1A and 1B after deposition of a thin, high-temperature anti-stiction coating.
Figure 2B:
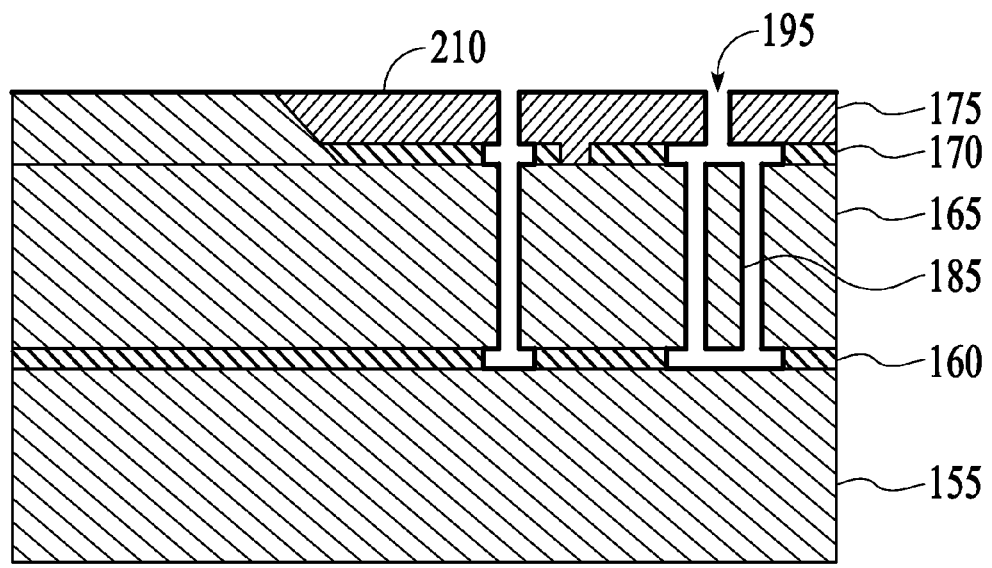

FIGS. 2A and 2B show schematically layers in the encapsulated MEMS devices of FIGS. 1A and 1B after deposition of a thin anti-stiction coating. In FIGS. 2A and 2B heavy line 205 and 210 represents an anti-stiction film coating that is stable at high temperatures. Typically the film is between about 1 nm and 200 nm thick. It may even be thicker if no other characteristics of the device are compromised. In a particular embodiment, the silicon carbide layer might be used to seal the vents (195) in order to fabricate the anti-stiction and the sealing layer in the same process step. A preferred anti-stiction film is silicon carbide (SiC) deposited in a low-pressure chemical vapor deposition (LPCVD) process or plasma enhanced chemical vapor deposition (PECVD) process but sputter-deposited ceramic films such as aluminum nitride are also acceptable. These films are stable under subsequent processing steps at temperatures above 450° C. and even as hot as 1100° C. and above. For purposes of this application, any anti-stiction coating that maintains its anti-stiction properties even after being heated to temperatures greater than 450° C. is a "high-temperature" anti-stiction coating.

SiC films may be deposited by LPCVD at around 800° C. using precursor 1,3-disilabutane in a hot-wall reactor. See, for example, "Silicon Carbide for Enhanced MEMS Reliability," D. Gao, et al., Proceedings of the 2004 Sensors and Actuators Workshop, Hilton Head, S.C., 2004, incorporated herein by reference. A feature of the anti-stiction film is that it is an electrical insulator. A conductive film would create short circuits which could render the MEMS inoperable.

Figure 3A:
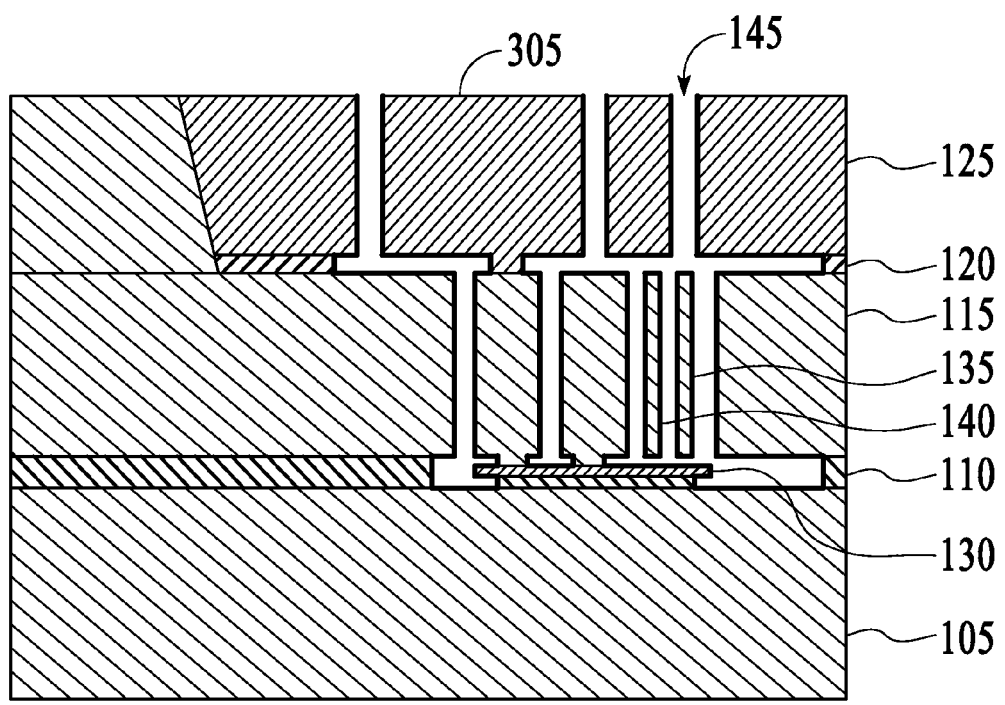
FIGS. 3A and 3B show schematically layers in the encapsulated MEMS devices of FIGS. 2A and 2B after an anisotropic etch.
Figure 3B:
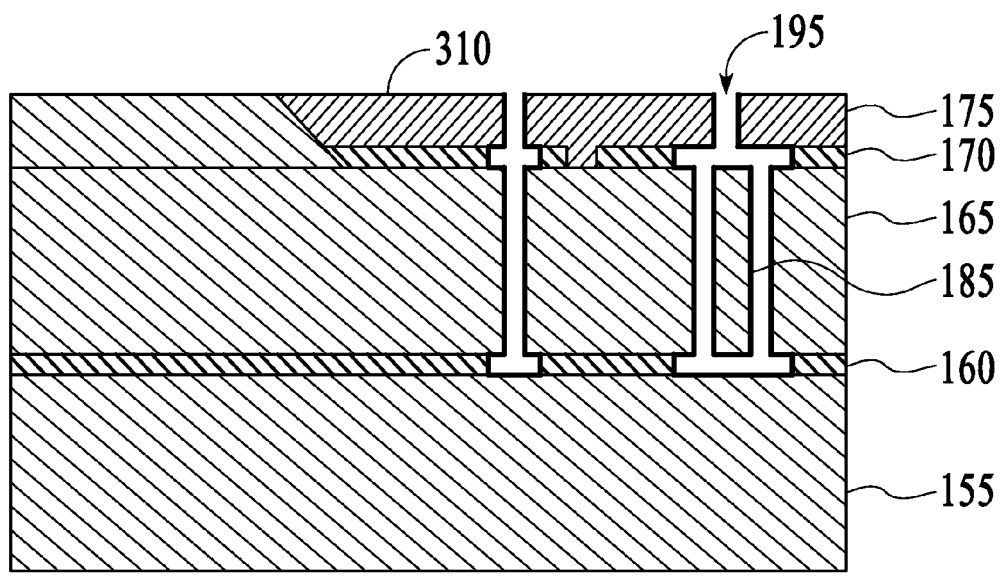

FIGS. 3A and 3B show schematically layers in the encapsulated MEMS devices of FIGS. 2A and 2B after an anisotropic etch. The purpose of the etch is to remove the anti-stiction film 205 or 210 to expose at least part of surface 305 or 310 to facilitate further processing and allow for electrical contacts to the underlying structures. The etch can be a reactive process such as hydrogen bromide reactive ion etching or a physical process such as ion milling in an argon plasma. There are several other options for the etch chemistry such as HCl, $CF_4+O_2$, $SF_6+O_2$, $NF_3$ $(+O_2)$, or $C_2F_6$. An anisotropic etch removes the portion of film 205 or 210 exposed on the top of the wafer while leaving the anti-stiction coating intact on internal surface such as the surface of devices 135, 140 and 185.

Figure 4A:
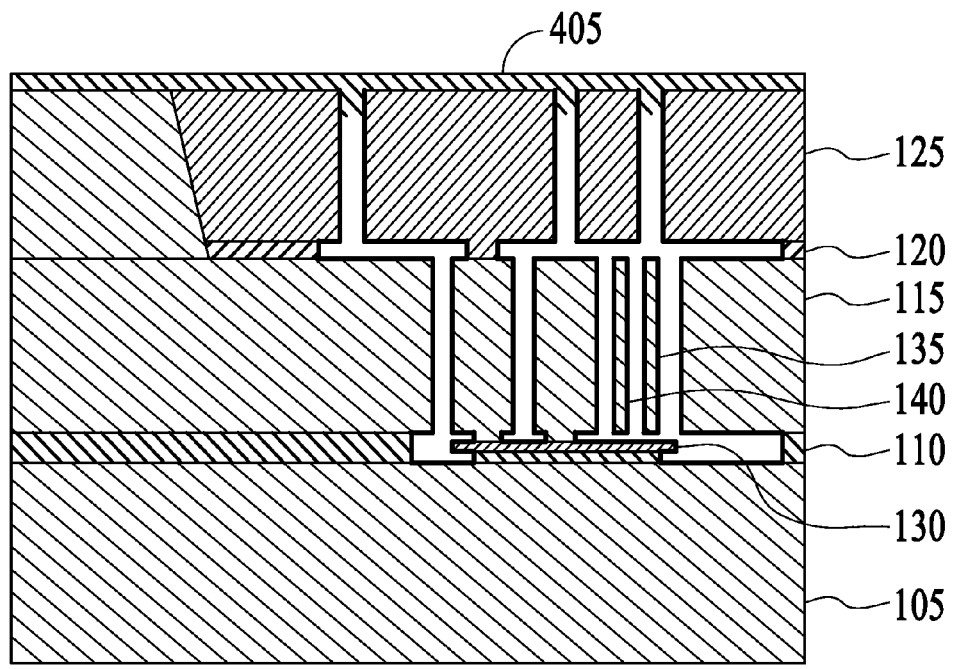
FIGS. 4A and 4B show schematically layers in the encapsulated MEMS devices of FIGS. 3A and 3B after sealing.
Figure 4B:
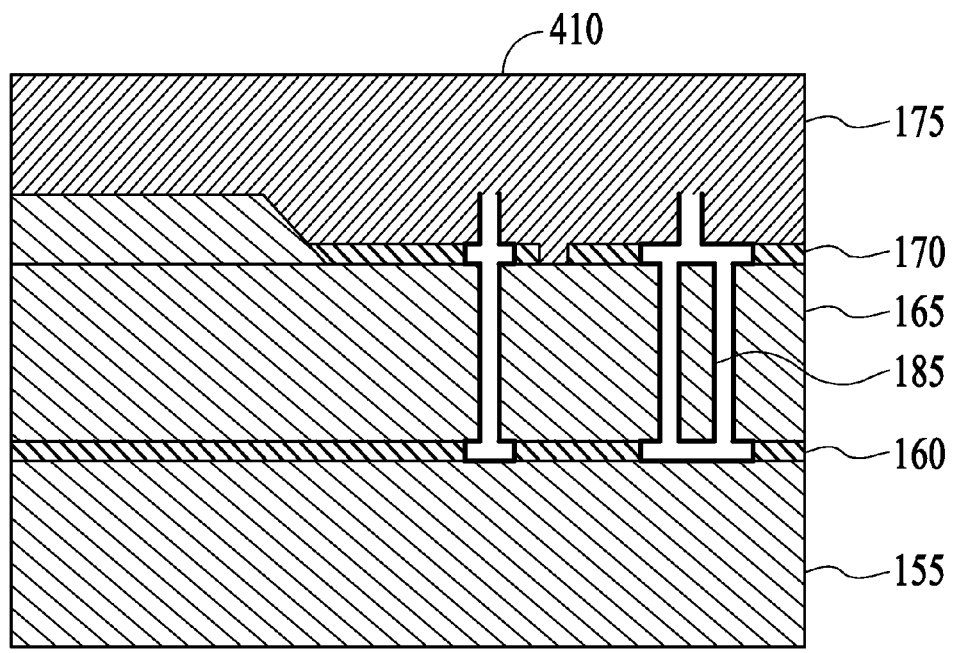
Figure 5A:
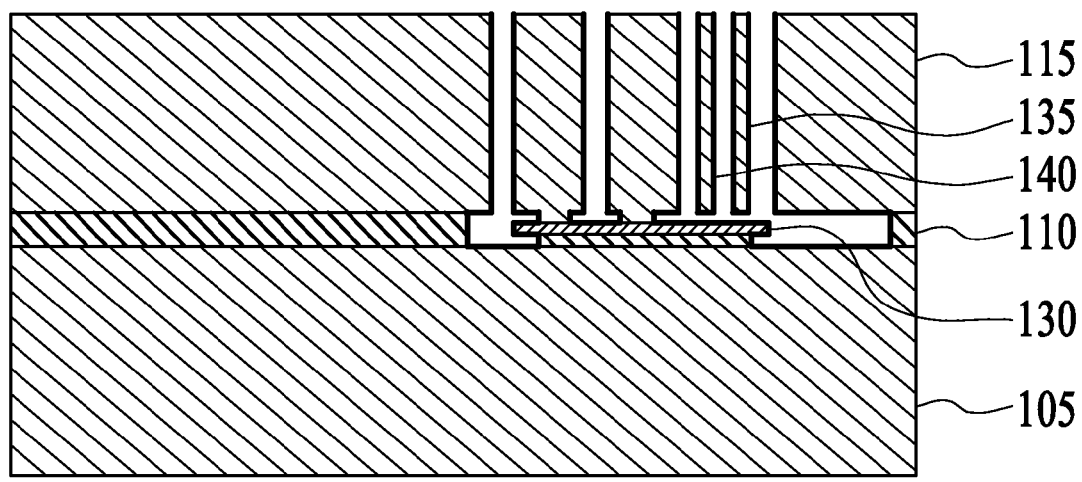
FIGS. 5A and 5B show schematically layers in MEMS devices with an anti-stiction coating applied after initial active layer fabrication.
Figure 5B:
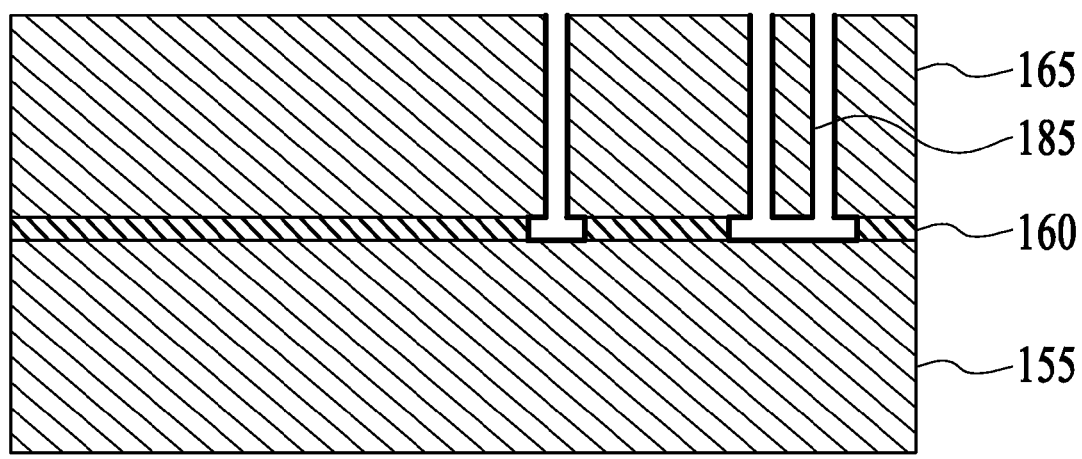

FIGS. 4A and 4B show schematically layers in the encapsulated MEMS devices of FIGS. 3A and 3B after sealing. Sealing is the process of closing up vents such as vents 145 and 195 in FIGS. 3A and 3B. In FIG. 4A layer 405 is a deposited low-temperature oxide layer while in FIG. 4B layer 410 is an epitaxially grown silicon layer. When an epitaxial silicon layer is used as a seal as illustrated in FIG. 4B, a film of silicon will be deposited over the anti-stiction coating on internal parts of the MEMS. The coating may retain its anti-stiction properties, however. Maintaining the anti-stiction properties after redeposition of Si may be enhanced by depositing carbon-rich SiC films as anti-stiction coatings. Supported by the high temperatures during the epitaxial sealing process, diffusion will lead to the forming of carbide between the excess carbon in the anti-stiction coating and the extra deposited Si. Hence, even if extra Si has been deposited, it will form SiC again after the high temperature treatment and thus again support the anti-stiction properties. Anti-stiction coatings increase the stiffness of the surface to which they are applied thereby decreasing the local compliance. A thin silicon overcoat should preserve this behavior. On the other hand low temperature oxide sealing avoids these complications and is therefore preferred if silicon overcoating presents a problem. Further, SiC itself may be used as the layer sealing the vents to avoid overcoating problems.

It is also possible to deposit and pattern an anti-stiction film after fabrication of the active device layer but before deposition of an encapsulation layer. FIGS. 5A and 5B show schematically layers in MEMS devices with an anti-stiction coating applied at this point. FIGS. 5A and 5B represent the structures depicted in FIGS. 1A and 1B but at an earlier stage of processing.

In FIG. 5A layer 105 is a substrate such as a silicon wafer. Clearly other substrate materials such as germanium or III-V materials may be desirable for certain applications. Layer 110 is a buried insulator (normally oxide) layer. Layer 115 is the device layer and normally consists of single- or poly-crystalline epitaxial silicon; however, other materials are possible just as for substrate 105. Substrate 105 and layers 110 and 115 may be conveniently provided in the form of a silicon-on-insulator (SOI) wafer. SOI wafers created by either buried oxide implants or wafer bonding techniques are widely available. Layer 130 is a buried polysilicon layer which serves as an electrical interconnect for MEMS devices. Items 135 and 140 are released MEMS devices.

In FIG. 5B layer 155 is a substrate such as a silicon wafer. Layer 160 is a buried insulator (normally oxide) layer. Layer 165 is the device layer and normally consists of single- or poly-crystalline epitaxial silicon; however, other materials are possible just as for substrate 155. Layers 155, 160 and 165 are often provided as an SOI wafer as mentioned above. Item 185 is a released MEMS device.

In the scenario shown in FIGS. 5A and 5B the anti-stiction film is applied to the device layer directly. An anisotropic etch then removes the film from exposed surfaces but does not attack the sides of MEMS devices (e.g. devices 135, 140, 185). The vertical sidewalls of a device are most likely to experience stiction in the absence of an anti-stiction coating. Device processing proceeds conventionally after this point as described in Partridge or Candler.

For example, a sacrificial layer would then be deposited and followed by a conventional multi-step sealing process. This approach requires good control over the anisotropy of the anti-stiction-film etch. The subsequent redeposition and etching of a sacrificial film may affect the anti-stiction properties of the anti-stiction film.

FIGS. 6-11 illustrate alternative embodiments that include the formation of a silicon carbide (SiC) anti-stiction coating by carbonization of a Si surface of a MEMS structure in the MEMS process. In addition, an embodiment includes combining the formation of the anti-stiction coating and subsequent encapsulation in a single reactor, thus avoiding exposure of the anti-stiction coating to ambient air, which can cause oxidation of the SiC.

The previous figures illustrate a novel encapsulation process, also referred to as an "InChip" process. By way of review, a device is defined in a thick layer of epitaxial silicon (either single- or poly-crystalline). This step is followed by the deposition of a sacrificial spacer layer (typically SiO2). Then an epitaxial film of silicon is deposited as an initial encapsulation step. This film is then patterned and the device is released in a dry etching process (As shown in FIGS. 1A and 1B). In the normal course of the process, the device is then sealed. The final seal can be accomplished by various mechanisms: a second epitaxial polysilicon film is deposited or a low temperature oxide (LTO) film is applied via a LPCVD process. Alternatively, the device can be sealed with silicon carbide such that the anti-stiction coating is formed at the same time as the seal. The silicon carbide can be deposited, e.g. in a low-pressure chemical vapor deposition (LPCVD) process, a plasma enhanced chemical vapor deposition (PECVD) process, or an atmospheric pressure chemical vapor deposition (APCVD). An alternative embodiment includes an interruption of the InChip process As further described and illustrated below, embodiments include the formation of an extremely thin anti-stiction film (for example, several nm thick) that is stable at high temperature onto the active device layer during the InChip process by carbonization of the MEMS structure. This is achieved in an embodiment by flowing a carbon source gas (e.g. propane) over the wafer with the released MEMS structures at a high temperatures, including temperatures of approximately 1000° C., such as temperatures between 900° C. and 1400° C.

An embodiment of a fabrication process uses an epitaxial silicon or silicon carbide reactor. This allows for the subsequent encapsulation of the MEMS structure in the same reactor without exposure of the carbonized silicon to ambient air, which could result in an oxidation of the SiC. The encapsulation can be done at reduced pressure which results in a reduced pressure in the cavity (suitable for MEMS resonators and gyroscopes) or at elevated pressure (e.g. with nitrogen back pressure) which leads to pressurized cavities (suitable for accelerometers). In another embodiment, the carbonization includes the usage of a SiC atmospheric chemical vapor deposition (APCVD) reactor. This allows for the subsequent encapsulation of the MEMS structure with SiC APCVD (e.g. with hydrogen or argon back pressure) which would result in pressurized cavities.

Another embodiment of the process includes the carbonization of silicon to form an anti-stiction coating and the subsequent encapsulation with a separate process step. Here, the encapsulation can be done in a machine other than the one used to carbonize the silicon, such as an LPCVD oxide tube. In this embodiment the silicon carbide anti-stiction coating would get exposed to ambient air, which might cause oxidation of the silicon carbide.

Figure 6:
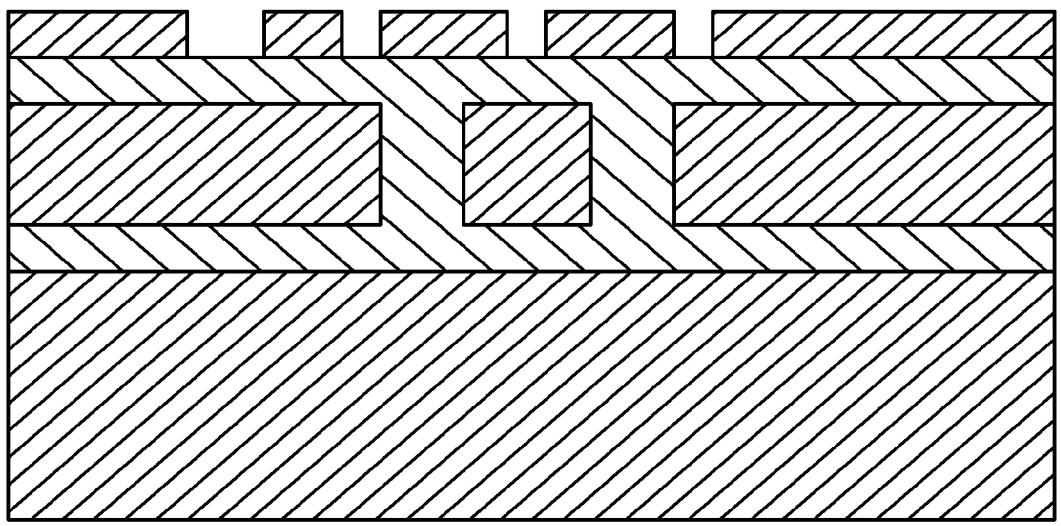
FIGS. 6-11 illustrate further alternative embodiments that include the formation of a silicon carbide (SiC) anti-stiction coating by carbonization of a Si surface of a MEMS structure in the MEMS process.

FIGS. 6-11 illustrate possible process sequence in the case of an epitaxial seal structure. FIG. 6 shows an epitaxial seal structure that has larger vents at the periphery of the mechanical structure. The epitaxial seal structure is shown before HF-vapor release.

Figure 7:
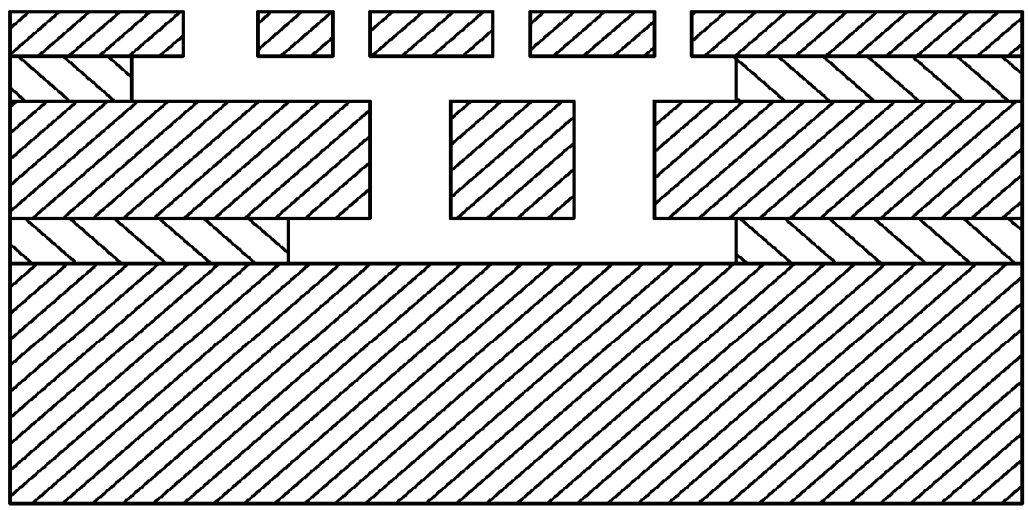

FIG. 7 shows the structure of FIG. 6 after HF vapor release. The larger vents at the periphery of the MEMS structure avoid redeposition of silicon or silicon oxide on the SiC anti-stiction coating in the latter encapsulation process. This is optional and may not be necessary if the encapsulation is achieved in a SiC APCVD process or redeposition of silicon or silicon oxide on the silicon carbide can be circumvented by other means (e.g. selective deposition). In an embodiment of this process the larger vent can be connected to the active MEMS structure by a long channel formed during the etching step of the active layer. The channel is designed such that during the carbonization process the carbon source gas (e.g. propane) reaches the active structure for an effective formation of the anti-stiction coating but also such that redeposition of the sealing material on the anti-stiction coating is avoided during the following sealing process.

Figure 8:
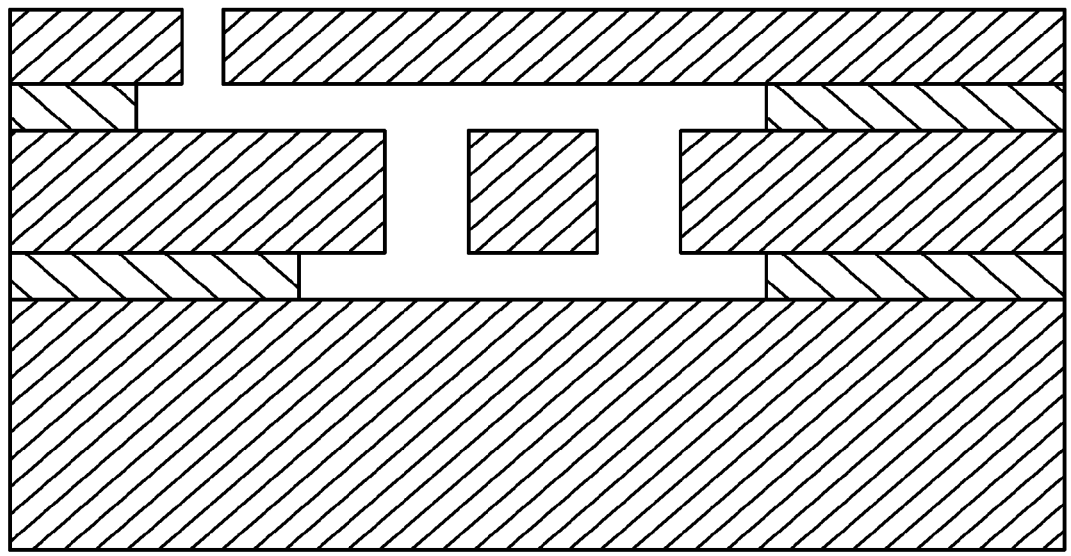

FIG. 8 shows the epitaxial seal structure after closing the smaller vents with an epitaxial silicon process.

Figure 9:
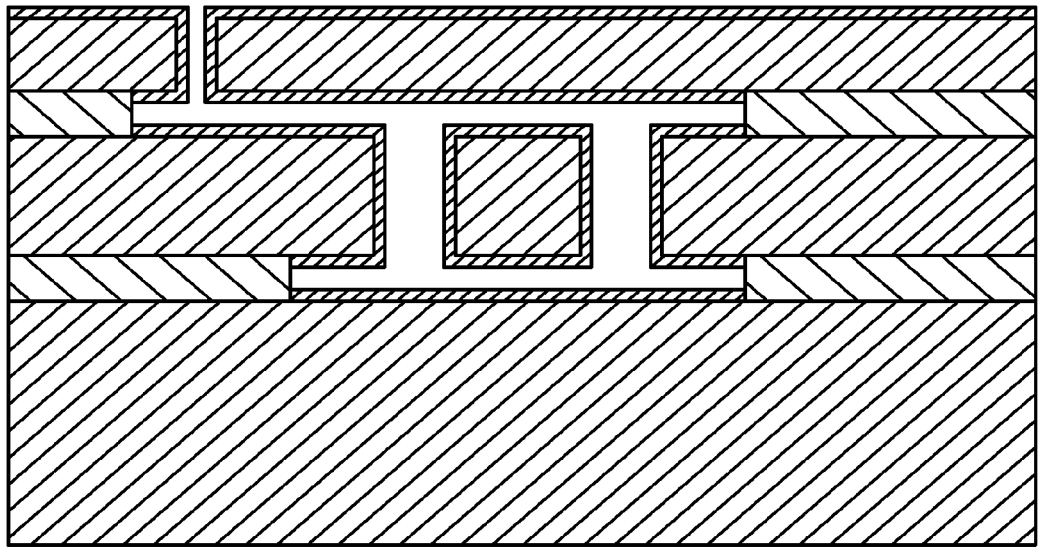

FIG. 9 shows formation of an SiC anti-stiction coating by carbonization of silicon. The carbonization is achieved by introducing a carbon source gas (e.g. propane) into the reactor at high temperature.

Figure 10:
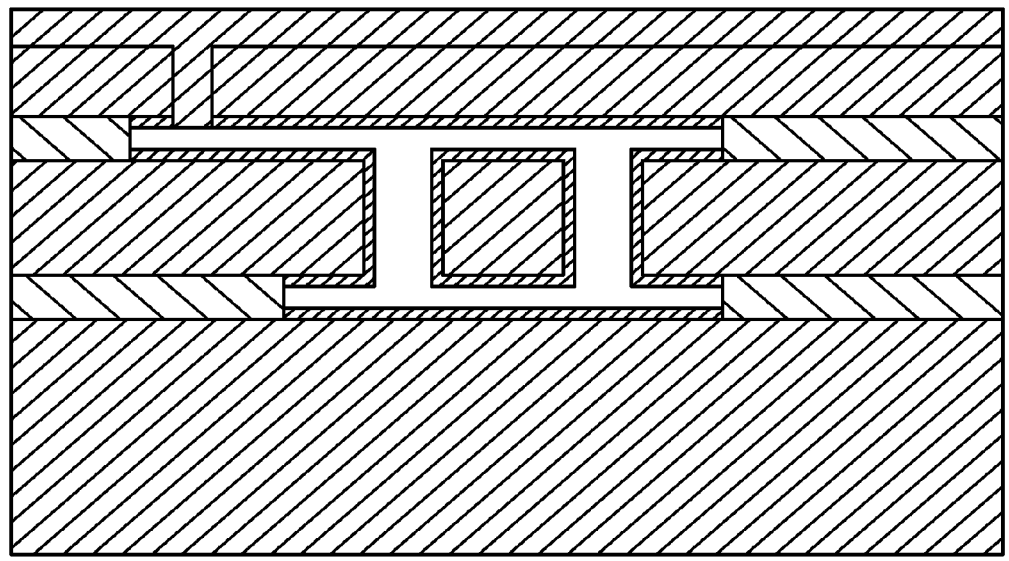

FIG. 10 shows the epitaxial seal structure after encapsulation with a SiC APCVD process, for example including argon back pressure.

Figure 11:
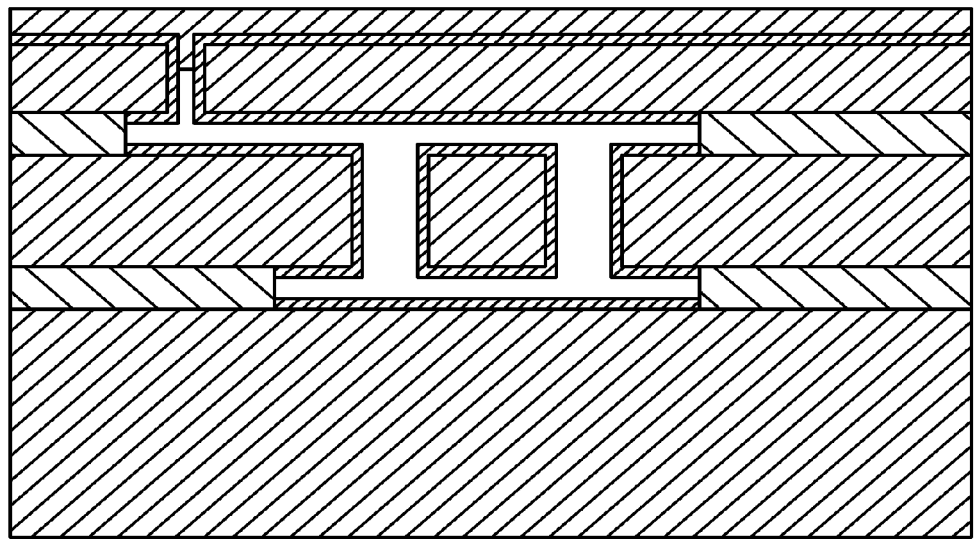

FIG. 11 shows the epitaxial seal structure after encapsulation with a silicon epitaxial process. The silicon epitaxial process can be performed at reduced or elevated pressure.

The processes described herein include a process for making a MEMS device comprising: providing on a substrate an encapsulated MEMS structure comprising a released device layer and a vented cap layer; forming a high-temperature stable anti-stiction coating on the MEMS structure; and, sealing the structure.

In an embodiment, at least part of the exposed top layer of the anti-stiction coating is removed before sealing.

In an embodiment, the structure is sealed with the same material used for the anti-stiction coating.

In an embodiment, the material is silicon carbide.

In an embodiment, the material is low pressure chemical vapor deposition (LPCVD) silicon carbide.

In an embodiment, forming comprises the deposition of the anti-stiction coating.

In an embodiment, the anti-stiction coating is formed by a substance reacting with the surface.

In an embodiment, the anti-stiction coating is a film of silicon carbide between about one nanometer and two hundred nanometers thick.

In an embodiment, the anti-stiction coating is a film of carbon-rich silicon carbide.

In an embodiment, the anti-stiction coating is a film of low pressure chemical vapor deposition (LPCVD) silicon carbide, plasma enhanced chemical vapor deposition (PECVD) silicon carbide, atmospheric pressure chemical vapor deposition (APCVD) silicon carbide.

In an embodiment, the anti-stiction coating is a film of aluminum nitride.

In an embodiment, the removing the exposed top layer is accomplished by a hydrogen bromide reactive ion etch.

In an embodiment, removing the exposed top layer is accomplished by ion milling in an argon plasma.

In an embodiment, the device layer and substrate are fabricated from a silicon-on-insulator wafer.

In an embodiment, sealing the structure is accomplished by deposition of low temperature oxide.

In an embodiment, sealing the structure is accomplished by epitaxial growth of silicon.

In an embodiment, forming of a stable high-temperature anti-stiction coating comprises carbonization of silicon by flowing a carbon source gas over the released structure at a high temperature.

In an embodiment, the high temperature is approximately 1000° C.

In an embodiment, the high temperature is greater than 1000° C.

In an embodiment, the process further comprises sealing the structure by epitaxial growth of silicon in a same reactor in which the depositing of the anti-stiction coating occurred.

In an embodiment, the process further comprises sealing the structure at a reduced pressure so as to create a reduced pressure environment for the encapsulated MEMS structure.

In an embodiment, the process further comprises sealing the structure at an elevated pressure so as to create an elevated pressure environment for the encapsulated MEMS structure.

In an embodiment, the process further comprises sealing the structure by epitaxial growth of silicon carbide in a same reactor in which the depositing of the anti-stiction coating occurred.

In an embodiment, the process further comprises sealing the structure by atmospheric chemical vapor deposition (APCVD) of silicon carbide in a same reactor in which the depositing of the anti-stiction coating occurred.

In an embodiment, encapsulating comprises using an APCVD reactor with hydrogen back pressure.

In an embodiment, encapsulating comprises using an APCVD reactor with argon back pressure.

Embodiments described herein further include a process for making a MEMS device comprising: providing on a substrate a MEMS structure comprising a released device layer; forming a high-temperature stable anti-stiction coating on the MEMS structure; removing part of the exposed top layer of the anti-stiction coating; and, encapsulating the structure.

In an embodiment, the structure is sealed with the same material used for the anti-stiction coating.

In an embodiment, forming comprises the deposition of the anti-stiction coating.

In an embodiment, the anti-stiction coating is formed by a substance reacting with the surface.

In an embodiment, forming of a stable high-temperature anti-stiction coating comprises carbonization of silicon by flowing a carbon source gas over the released structure at a high temperature.

In an embodiment, the high temperature is approximately 1000° C.

In an embodiment, the high temperature is greater than 1000° C.

In an embodiment, the anti-stiction coating is a film of silicon carbide between about one nanometer and two hundred nanometers thick.

In an embodiment, the anti-stiction coating is a film of carbon-rich silicon carbide.

In an embodiment, the anti-stiction coating is a film of aluminum nitride.

In an embodiment, the removing the exposed top layer is accomplished by a hydrogen bromide reactive ion etch.

In an embodiment, the removing the exposed top layer is accomplished by ion milling in an argon plasma.

In an embodiment, the device layer and substrate are fabricated from a silicon-on-insulator wafer.

In an embodiment, encapsulating the structure is accomplished by epitaxial growth of silicon.

Embodiments described herein further include MEMS devices fabricated using the processes described and claimed herein.

As one skilled in the art will readily appreciate from the disclosure of the embodiments herein, processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

While the systems and methods described herein have been described in connection with what are presently considered to be the most practical and preferred embodiments, it is to be understood that the systems and methods are not limited to the disclosed embodiments and alternatives as set forth above, but on the contrary is intended to cover various modifications and equivalent arrangements included within the scope of the following claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other systems and methods, not only for the systems and methods described above.

The elements and acts of the various embodiments described above can be combined to provide further embodiments. These and other changes can be made to the systems and methods in light of the above detailed description.

Each publication, patent, and/or patent application mentioned in this specification is herein incorporated by reference in its entirety to the same extent as if each individual publication and/or patent application was specifically and individually indicated to be incorporated by reference.

In general, in the following claims, the terms used should not be construed to limit the systems and methods to the specific embodiments disclosed in the specification and the claims, but should be construed to include all systems that operate under the claims. Accordingly, the systems and methods are not limited by the disclosure, but instead the scope of the systems and methods are to be determined entirely by the claims.

What is claimed is:

1. A process for making a MEMS device comprising:
   providing on a substrate an encapsulated MEMS structure comprising a released device layer and a vented cap layer;
   depositing a sacrificial spacer layer;
   depositing an epitaxial film;
   patterning the film;
   forming a high-temperature stable anti-stiction coating on the MEMS structure; and,
   sealing the structure, wherein sealing the structure comprises forming the anti-stiction coating at the same time as sealing.

2. The process of claim 1 wherein at least part of the exposed top layer of the anti-stiction coating is removed before sealing.

3. The process of claim 1 wherein the structure is sealed with the same material used for the anti-stiction coating.

4. The process of claim 3 wherein the material is silicon carbide.

5. The process of claim 3 wherein the material is low pressure chemical vapor deposition (LPCVD) silicon carbide.

6. The process of claim 1 wherein forming comprises the deposition of the anti-stiction coating.

7. The process of claim 1 wherein the anti-stiction coating is formed by a substance reacting with the surface.

8. The process of claim 1 wherein the anti-stiction coating is a film of silicon carbide between about one nanometer and two hundred nanometers thick.

9. The process of claim 1 wherein the anti-stiction coating is a film of carbon-rich silicon carbide.

10. The process of claim 1 wherein the anti-stiction coating is a film of low pressure chemical vapor deposition (LPCVD) silicon carbide, plasma enhanced chemical vapor deposition (PECVD) silicon carbide, atmospheric pressure chemical vapor deposition (APCVD) silicon carbide.

11. The process of claim 1 wherein the anti-stiction coating is a film of aluminum nitride.

12. The process of claim 2 wherein removing the exposed top layer is accomplished by a hydrogen bromide reactive ion etch.

13. The process of claim 2 wherein removing the exposed top layer is accomplished by ion milling in an argon plasma.

14. The process of claim 1 wherein the device layer and substrate are fabricated from a silicon-on-insulator wafer.

15. The process of claim 1 wherein sealing the structure is accomplished by deposition of low temperature oxide.

16. The process of claim 1 wherein sealing the structure is accomplished by epitaxial growth of silicon.

17. The process of claim 7 wherein forming of a stable high-temperature anti-stiction coating comprises carbonization of silicon by flowing a carbon source gas over the released structure at a high temperature.

18. The process of claim 17 wherein the high temperature is approximately 1000° C.

19. The process of claim 17 wherein the high temperature is greater than 1000° C.

20. The process of claim 17 further comprising sealing the structure by epitaxial growth of silicon in a same reactor in which the depositing of the anti-stiction coating occurred.

21. The process of claim 17 further comprising sealing the structure at a reduced pressure so as to create a reduced pressure environment for the encapsulated MEMS structure.

22. The process of claim 17 further comprising sealing the structure at an elevated pressure so as to create an elevated pressure environment for the encapsulated MEMS structure.

23. The process of claim 17 further comprising sealing the structure by epitaxial growth of silicon carbide in a same reactor in which the depositing of the anti-stiction coating occurred.

24. The process of claim 17 further comprising sealing the structure by atmospheric chemical vapor deposition (APCVD) of silicon carbide in a same reactor in which the depositing of the anti-stiction coating occurred.

25. The process of claim 24, wherein encapsulating comprises using an APCVD reactor with hydrogen back pressure.

26. The process of claim 24, wherein encapsulating comprises using an APCVD reactor with argon back pressure.

27. A MEMS device fabricated using the process of claim 1.

* * * * *